(12) United States Patent
Kuan et al.

(10) Patent No.: US 8,592,286 B2
(45) Date of Patent: Nov. 26, 2013

(54) ULTRA-THIN WAFER SYSTEM AND METHOD OF MANUFACTURE THEREOF

(75) Inventors: Heap Hoe Kuan, Singapore (SG); Byung Tai Do, Singapore (SG)

(73) Assignee: Stats Chippac Ltd., Singapore (SG)

( * ) Notice: Subject to any disclaimer, the term of this patent is extended or adjusted under 35 U.S.C. 154(b) by 2347 days.

(21) Appl. No.: 11/163,116

(22) Filed: Oct. 5, 2005

(65) Prior Publication Data

US 2007/0075421 A1 Apr. 5, 2007

(51) Int. Cl.
*H01L 21/30* (2006.01)

(52) U.S. Cl.
USPC .................. 438/459; 257/734; 257/E21.237; 257/E21.508

(58) Field of Classification Search
USPC .................................... 438/459–460; 257/734
See application file for complete search history.

(56) References Cited

U.S. PATENT DOCUMENTS

| | | | |
|---|---|---|---|
| 6,852,572 B2 | 2/2005 | Haji et al. | 438/114 |
| 6,869,894 B2 | 3/2005 | Moore | 438/782 |
| 6,876,061 B2 | 4/2005 | Zandman et al. | 257/620 |
| 6,878,608 B2 * | 4/2005 | Brofman et al. | 438/459 |
| 6,879,026 B2 | 4/2005 | Fukumoto et al. | 257/642 |
| 7,141,487 B2 * | 11/2006 | Periasamy et al. | 438/459 |
| 7,232,740 B1 * | 6/2007 | Mountain | 438/459 |
| 7,682,935 B2 * | 3/2010 | Burke et al. | 438/459 |
| 2003/0224540 A1 * | 12/2003 | Watanabe et al. | 438/7 |
| 2004/0000714 A1 * | 1/2004 | Isobe | 257/737 |
| 2004/0009649 A1 * | 1/2004 | Kub et al. | 438/459 |
| 2005/0085008 A1 * | 4/2005 | Derderian et al. | 438/106 |
| 2006/0219351 A1 * | 10/2006 | Kuan et al. | 156/247 |

* cited by examiner

*Primary Examiner* — A. Sefer
(74) *Attorney, Agent, or Firm* — Ishimaru & Associates LLP; I-Chang John Yang

(57) ABSTRACT

An ultra-thin wafer system providing thinning a wafer on a protective tape to an ultra-thin thickness and forming electrical interconnects on the thinned wafer on a support plate.

11 Claims, 3 Drawing Sheets

ULTRA-THIN WAFER SYSTEM AND METHOD OF MANUFACTURE THEREOF

TECHNICAL FIELD

The present invention relates generally to semiconductor wafer processing systems, and more particularly to a system for wafer thinning and electrical interconnect.

BACKGROUND ART

Modern consumer electronics particularly personal portable devices, such as cellular phones, digital cameras, and music players, require miniaturization as well as increasing integrated circuit die content to fit an ever shrinking physical space. Numerous technologies have been developed to meet these requirements. One of these technologies involves making the integrated circuit die content as thin as possible.

Integrated circuit wafers are fabricated to be as thin as possible through processes such as thinning, grinding, or lapping. These processes are applied to the wafers after fabricating the wafer including forming electrical interconnect, such as solder bumps, on the wafer. The ultra thin wafers are prone to bowing, warping, cracking or breaking due to many factors including the thinness of the wafers.

Furthermore, protecting the wafer from deformation and damage can also create problems. One such problem is protecting electrical interconnect during thinning. To date, the protective materials cause detachment or damage of the electrical interconnect, particularly when the protective materials are removed after thinning.

Electrical interconnects are critical for the next level of integration of the integrated circuit die, such as a packaging, substrate attachment or printed circuit board mounting. Detection can be costly and difficult. As such, detachment and damage of electrical interconnect often result in scrap during fabrication through the integration into the end consumer electronics product.

Consequently, numerous approaches have been attempted to solve wafer deformation and damage. Some of these approaches require additional physical structures on the active side or back side of the wafer. Although these structures alleviate deformation and damage, they often cause deformation or damage to the wafer surface as well as electrical interconnect attached or formed on the wafer surface.

Thus, a need still remains for a method to control deformation and damage in processing ultra thin wafers. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an ultra-thin wafer system providing thinning a wafer on a wafer protective tape to an ultra-thin thickness and forming electrical interconnects on the thinned wafer on a support plate.

Certain embodiments of the invention have other advantages in addition to or in place of those mentioned or obvious from the above. The advantages will become apparent to those skilled in the art from a reading of the following detailed description when taken with reference to the accompanying drawings.

BEST MODE FOR CARRYING OUT THE INVENTION

Figure 1:
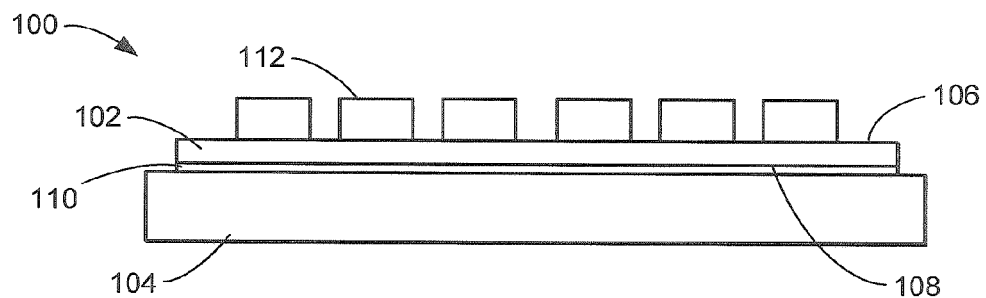
FIG. 1 is a cross-sectional view of an ultra-thin wafer system in an embodiment of the present invention.

In the following description, numerous specific details are given to provide a thorough understanding of the invention. However, it will be apparent that the invention may be practiced without these specific details. In order to avoid obscuring the present invention, some well-known circuits, package configurations, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the wafer, solder, tape, and plate as oriented downward, this arrangement in the FIGs. is arbitrary and is not intended to suggest that the integrated circuits should necessarily be attached in a downward direction. Generally, the device can be operated in any orientation. The same numbers are used in all the drawing FIGs. to relate to the same elements.

The term "horizontal" as used herein is defined as a plane parallel to the conventional plane or surface of the lead frame, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an ultra-thin wafer system 100 in an embodiment of the present invention. The ultra-thin wafer system 100 includes a wafer 102 attached to a support plate 104, the support plate 104 provides structural support, planar rigidity and thermal immunity. The wafer 102 includes a wafer active surface 106 and a wafer non-active surface 108, wherein the wafer non-active surface 108 is attached to the support plate 104 with a temporary adhesive 110. The wafer 102 is shown after thinning and prior to forming electrical interconnects 112 on the wafer active surface 106. The support plate 104 maintains structural integrity and planar conformity of the wafer 102 for forming the electrical interconnects 112, such as solder bumps.

For illustrative purposes the electrical interconnects 112 are shown as formed using a deposition method, although it is understood that any other solder method, such as solder printing or electroplating, may be used, as well. Further, it is understood that any other interconnect method, process or tool may be used, as well.

Figure 2:
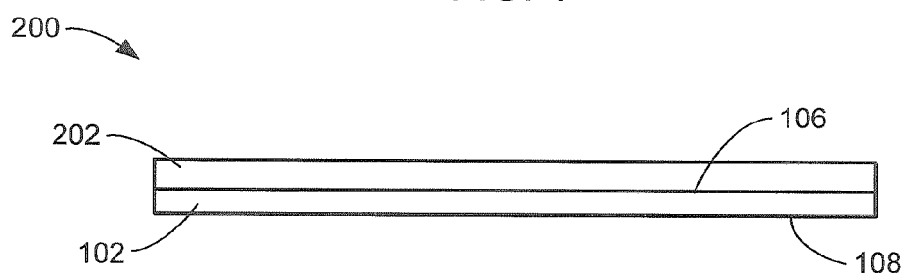
FIG. 2 is a cross-sectional view of a tape attaching phase for a protective tape of the ultra-thin wafer system.

Referring now to FIG. 2, therein is shown a cross-sectional view of a tape attaching phase 200 for a wafer protective tape 202 of the ultra-thin wafer system 100. The wafer protective tape 202 attaches to and protects the wafer active surface 106 for wafer thinning. The wafer active surface 106 may include electrical attachment sites (not shown) for the electrical interconnects 112. Further the wafer protective tape 202 may provide protection to active circuits (not shown) on the wafer active surface 106, or near the wafer active surface 106 also referred to as the active surface. The wafer non-active surface 108 is exposed and the wafer 102 is shown prior to thinning.

For illustrative purposes, the wafer protective tape 202 is shown as a homogenous material, although it is understood that it may be heterogeneous, as well. Further, it is understood that the wafer protective tape 202 may be any material that protects the wafer active surface 106, as well.

Figure 3:
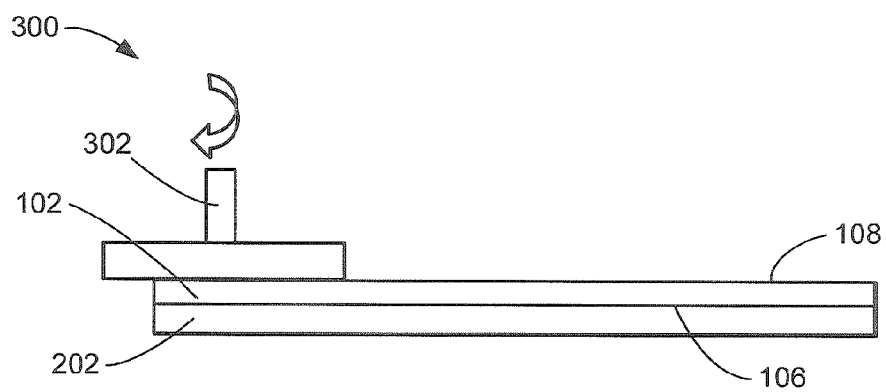
FIG. 3 is a cross-sectional view of a cross-sectional view of a wafer thinning phase for the wafer of the ultra-thin wafer system.

Referring now to FIG. 3, therein is shown a cross-sectional view of a wafer thinning phase 300 for the wafer 102 of the ultra-thin wafer system 100. The wafer active surface 106 is protected during thinning by the wafer protective tape 202. The wafer non-active surface 108 is exposed to a thinning apparatus 302. The thinning apparatus 302 thins the wafer 102 by removing layers of wafer material from the wafer non-active surface 108. The thinning or removing material from the wafer non-active surface 108 reduces the wafer 102 in a planar manner resulting in a consistent thickness, height, or z-dimension. The wafer 102 may have an initial thickness of approximately 600 um (26 mils) to approximately 740 um (29 mils). The thinning apparatus 302 thins the wafer 102 to a "thin" thickness of 150 um (6 mils) or an "ultra-thin" thickness of approximately 25 um (1 mil) to approximately 50 um (2 mils).

For illustrative purposes the thinning apparatus 302 is shown as a simplified grinding tool, although it is understood that any other wafer thinning method, process or tool may be used, as well. Further, it is understood that the thinning apparatus 302 may be different, as well.

Figure 4:
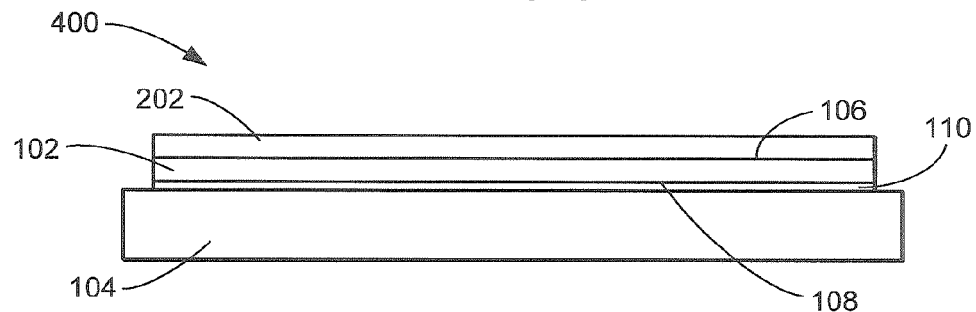
FIG. 4 is a cross-sectional view of a cross-sectional view of a plate mounting phase for the support plate of the ultra-thin wafer system.

Referring now to FIG. 4, therein is shown a cross-sectional view of a plate mounting phase 400 for the support plate 104 of the ultra-thin wafer system 100. After completing the thinning or removing material from the wafer non-active surface 108, the support plate 104 is mounted to the wafer non-active surface 108. The temporary adhesive 110 secures the mounting of the wafer 102 and the support plate 104. The support plate 104 provides structural support, planar rigidity and thermal immunity for further processing. The wafer protective tape 202 remains attached to the wafer active surface 106 during the mounting of the support plate 104.

For illustrative purposes the temporary adhesive 110 is shown as a homogenous layer, although it is understood that it may be heterogeneous, as well. Further, it is understood that the temporary adhesive 110 may be spun-on or sprayed, or a paste or tape.

Figure 5:
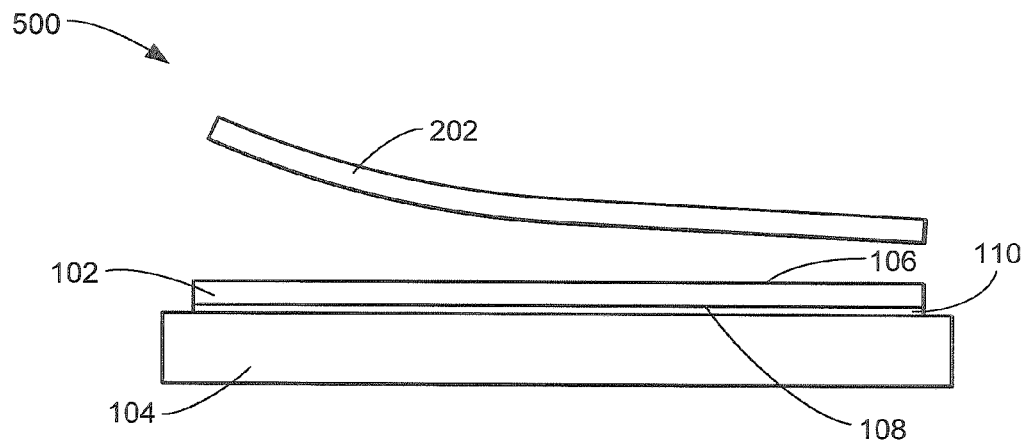
FIG. 5 is a cross-sectional view of a detaping phase for the protective tape of the ultra-thin wafer system.

Referring now to FIG. 5, therein is shown a cross-sectional view of a detaping phase 500 for the wafer protective tape 202 of the ultra-thin wafer system 100. The wafer 102 after thinning is shown with the support plate 104 thereon and the wafer protective tape 202 removed. The wafer protective tape 202 is removed to expose the wafer active surface 106 after the wafer 102 is mounted to the support plate 104. The wafer non-active surface 108 is attached to the support plate 104 with the temporary adhesive 110, the support plate 104 providing structural support and planar rigidity to the wafer 102.

For illustrative purposes the wafer active surface 106 is shown as planar, although it is understood the wafer active surface 106 may have recesses and protrusions, as well. Further, it is understood that the wafer active surface 106 may include electrical attachment sites (not shown) for the electrical interconnects 112.

Figure 6:
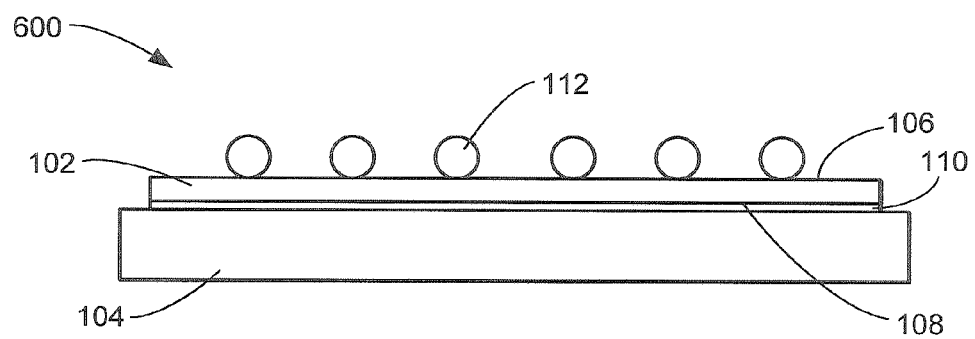
FIG. 6 is a cross-sectional view of an interconnect forming phase for the electrical interconnects of the ultra-thin wafer system.

Referring now to FIG. 6, therein is shown a cross-sectional view of an interconnect forming phase 600 for the electrical interconnects 112 of the ultra-thin wafer system 100. The support plate 104 provides structural support and planar rigidity during the forming of the electrical interconnects 112. The electrical interconnects 112 formed on the wafer active surface 106 may be heated and exposed to chemicals. As such, the support plate 104 and the temporary adhesive 110 will be thermally and chemically immune to heating the electrical interconnects 112.

For illustrative purposes the electrical interconnects 112 are shown as formed using a ball drop method, although it is understood that any other solder deposition method, such as solder printing or electroplating, may be used, as well. Further, it is understood that any other interconnect method, process or tool may be used, as well.

Figure 7:
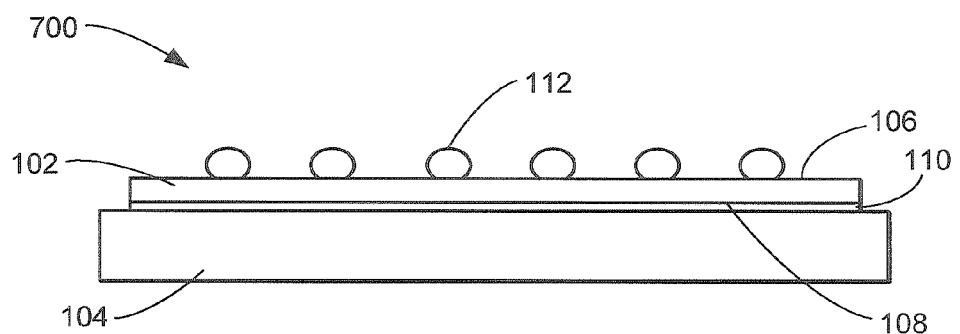
FIG. 7 is a cross-sectional view of an interconnect re-forming phase for the electrical interconnects of the ultra-thin wafer system.

Referring now to FIG. 7, therein is shown a cross-sectional view of an interconnect re-forming phase 700 for the electrical interconnects 112 of the ultra-thin wafer system 100. The electrical interconnects 112, such as solder, may be heated to further form and adhere to the wafer active surface 106. The support plate 104 provides structural support and planar rigidity during the further forming and adhering of the electrical interconnects 112. As such, the support plate 104 and the temporary adhesive 110 will be thermally immune to heating the electrical interconnects 112.

For illustrative purposes, the electrical interconnects 112 are shown as reflowed solder bumps, although it is understood that any other solder bump finishing method may be used, as well. Further, it is understood that any other interconnect method, process or tool may be used, as well.

Figure 8:
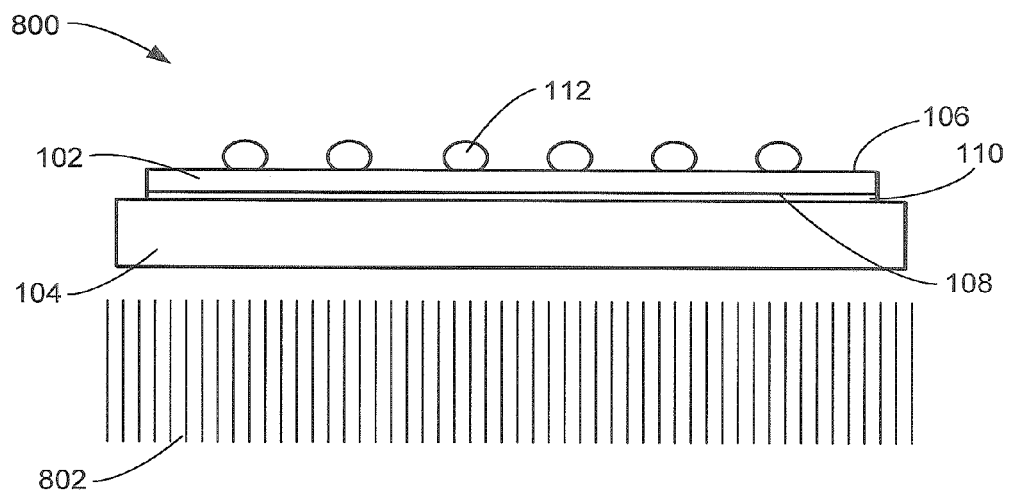
FIG. 8 is a cross-sectional view of an adhesive release phase for the temporary adhesive of the ultra-thin wafer system.

Referring now to FIG. 8, therein is shown a cross-sectional view of an adhesive release phase 800 for the temporary adhesive 110 of the ultra-thin wafer system 100. The temporary adhesive 110 mounting the support plate 104 to the wafer non-active surface 108 is designed to be easily removed. The release of the adhesive properties of the temporary adhesive 110 may be provided by an irradiation source 802. The temporary adhesive 110 may chemically react with the irradiation of the irradiation source 802 and change to a non-adhesive form.

For illustrative purposes, the adhesive release phase 800 is shown using the irradiation source 802 to release the temporary adhesive 110, although it is understood that any other irradiation method, process or tool may be used, as well. Further, it is understood that any other release method, process or tool may be used, as well.

Figure 9:
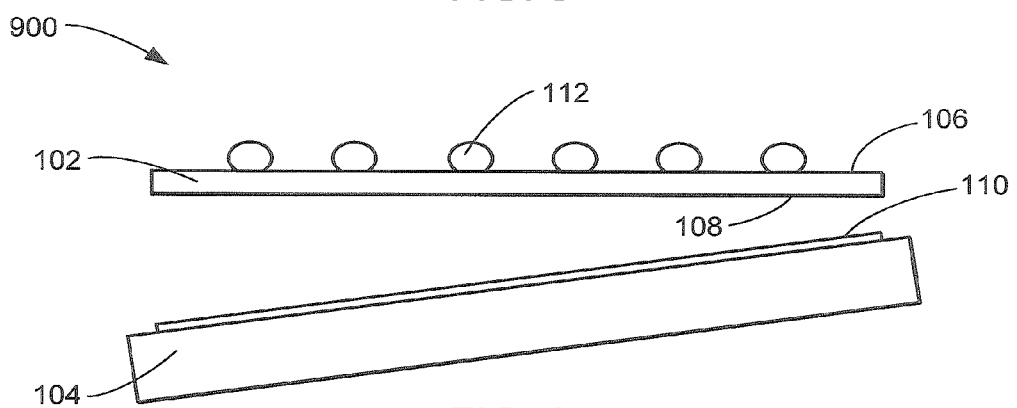
FIG. 9 is a cross-sectional view of a plate removal phase for the support plate of the ultra-thin wafer system.

Referring now to FIG. 9, therein is shown a cross-sectional view of a plate removal phase 900 for the support plate 104 of the ultra-thin wafer system 100. Following the adhesive release phase 800 for the temporary adhesive 110, the temporary adhesive 110 and the support plate 104 are removed. The wafer non-active surface 108 may be cleaned and the wafer non-active surface 108 fully exposed for further processing. The ultra-thin wafer system 100 provides the wafer 102 after thinning, having the electrical interconnects 112 formed thereon.

For illustrative purposes, the plate removal phase 900 is shown with the support plate 104 and the temporary adhesive 110 removed together, although it is understood that they may be removed separately, as well. Further, it is understood that any other removal or cleaning method, process or tool may be used, as well.

Figure 10:
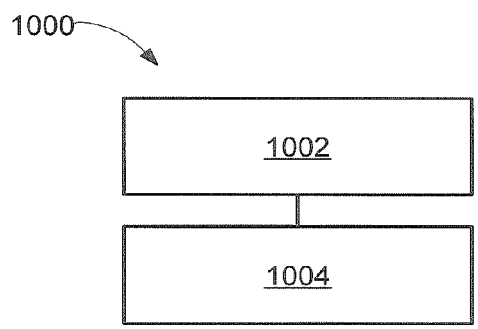
FIG. 10 is a flow chart of an ultra-thin wafer system for wafer processing in an embodiment of the present invention.

Referring now to FIG. 10, therein is shown a flow chart of an ultra-thin wafer system 1000 for wafer processing in an embodiment of the present invention. The system 1000 includes thinning a wafer on a wafer protective tape to an ultra-thin thickness in a block 1002; and forming electrical interconnects on the thinned wafer on a support plate in a block 1004.

In greater detail, a method to fabricate the ultra-thin wafer system 100, according to an embodiment of the present invention, is performed as follows:

(1) 1. The wafer protective tape 202 is attached to the wafer 102 to protect the wafer active surface 106, the wafer active surface may include electrical attachment sites (not shown), during wafer thinning. (FIG. 2)
(2) 2. The thinning apparatus 302, such as a grinder, a lapper, a polisher, or chemical dispenser, removes wafer material from the wafer non-active surface 108 thereby thinning the wafer 102. (FIG. 3)
(3) 3. Thinning the wafer 102 may include rough grinding, fine grinding, wet etching, dry etching, chemical polishing, mechanical polishing or chemical-mechanical polishing the wafer non-active surface 108 to thin the wafer 102. (FIG. 3)
(4) 4. The electrical interconnects 112 are formed on the wafer active surface 106 of the wafer 102 after thinning, the wafer 102 after thinning having the support plate 104 providing structural support and planar rigidity. (FIG. 6)
(5) 5. After thinning the wafer 102 is further processed to remove the support plate 104 using irradiation such as light or light component from an irradiation source 802 such as a laser. (FIG. 8)

It has been discovered that the present invention thus has numerous advantages.

An advantage is that the present invention improves the thinning of wafers. The further thinning allows improved packaging, mounting or attaching particularly with respect to physical space sensitive products. The improvement in the fabrication methods, manufacturing processes and product yields result from several advantages of the present invention. Improving the reliability and performance results in a reduction of scrap and more importantly failures in higher level systems, particularly those in the field.

It has been discovered that the disclosed structure provides structural support and planar rigidity needed for processing ultra thin wafers allowing electrical interconnect, such as solder bumps, to be formed after wafer thinning. This eliminates the use of a protective layer for the electrical interconnect needed in conventional processes, thus improving the integrity and reliability of the electrical interconnect formed on the wafer surface.

It has also been discovered that the disclosed structure provides improvements in the size and shape of the electrical interconnect. Since wafer thinning is accomplished before making of the electrical interconnects, conventional bumping processes, such as those for non-thinned wafers, can be used that produce and require taller and larger electrical interconnects. Further, any processing requiring increased heat may also be used allowing additional manufacturing flexibility and reduced fabrication costs.

Yet another discovery of the disclosed structure is improvements in the wafer non-active surface thinning and finishing processes. Conventional wafer thinning processes, such as those for wire-bonded wafers, can be used for thinning and finishing the wafer non-active surface. Further, any processing requiring increased heat may also be used allowing additional manufacturing flexibility and reduced fabrication costs.

Yet another discovery of the disclosed structure is a wider range of dimensions and quantities for electrical interconnect. In addition to conventional processes and materials, newer technologies utilizing smaller electrical interconnect, spacing and larger numbers of electrical interconnect are facilitated.

Yet another discovery is that the process allows ultra-thin wafers with solder balls having high bump heights defined as greater than 200 μm, since bumping processes such as a ball drop process can be used after wafer thinning. Also since wafer warping after thinning is eliminated, it has been discovered that bumping processes such as solder printing or electroplating can be performed to provide solder bumps having intermediate bump heights defined as being from about 80 to 150 μm.

These and other valuable aspects of the present invention consequently further the state of the technology to at least the next level.

Thus, it has been discovered that the ultra-thin wafer system 100 method and apparatus of the present invention furnish important and heretofore unknown and unavailable solutions, capabilities, and functional advantages for wafer thinning and electrical interconnect. The resulting processes and configurations are straightforward, cost-effective, uncomplicated, highly versatile and effective, can be implemented by adapting known technologies, and are thus readily suited for efficiently and economically manufacturing integrated circuit package devices. The resulting processes and configurations are straightforward, cost-effective, uncomplicated, highly versatile, accurate, sensitive, and effective, and can be implemented by adapting known components for ready, efficient, and economical manufacturing, application, and utilization.

The resulting processes and configurations are straightforward, cost-effective, uncomplicated, highly versatile and effective, can be implemented by adapting known technologies, and are thus readily suited for efficiently and economically manufacturing ultra thin wafers with electrical interconnect.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an ultra-thin wafer system comprising:
    thinning a wafer on a wafer protective tape to an ultra-thin thickness;
    forming electrical interconnects on the wafer, wherein forming the electrical interconnects comprises applying a temporary adhesive between a support plate and a non-active surface of the wafer;

releasing the temporary adhesive using an irradiation process; and removing the support plate after forming the electrical interconnects.

2. The method as claimed in claim 1 wherein forming the electrical interconnects comprises depositing solder on the wafer.

3. The method as claimed in claim 1 wherein:

thinning the wafer comprises attaching the wafer protective tape to an active surface of the wafer to protect active circuits thereon; and further comprising:

removing the wafer protective tape before forming the electrical interconnects.

4. The method as claimed in claim 1 wherein thinning the wafer comprises grinding, etching or polishing the non-active surface of the wafer to thin the wafer.

5. A method of manufacture of an ultra-thin wafer system comprising:

thinning a wafer on a wafer protective tape to an ultra-thin thickness;

mounting a support plate to a non-active surface of the wafer to protect the wafer from breaking or deforming;

applying a temporary adhesive between the support plate and the non-active surface of the wafer;

forming electrical interconnects on an active surface of the wafer having the support plate thereon;

releasing the temporary adhesive using an irradiation process; and removing the support plate from the wafer having the electrical interconnects formed thereon.

6. The method as claimed in claim 5 wherein applying the temporary adhesive comprises spin-coating a temporary adhesive paste having thermal and chemical immunity for forming the electrical interconnects, between the support plate and the non-active surface of the wafer.

7. The method as claimed in claim 5 wherein applying the temporary adhesive comprises tape laminating a temporary adhesive tape material having thermal and chemical immunity for forming the electrical interconnects, between the support plate and the non-active surface of the wafer.

8. The method as claimed in claim 5 wherein the support plate comprises a material providing structural support, planar rigidity, thermal and chemical immunity for forming the electrical interconnects.

9. The method as claimed in claim 5 wherein forming the electrical interconnects comprises depositing solder on the active surface of the wafer.

10. The method as claimed in claim 5 wherein thinning the wafer comprises attaching the wafer protective tape to the active surface of the wafer to protect active circuits thereon.

11. The method as claimed in claim 5 wherein thinning the wafer comprises rough grinding, fine grinding, wet etching, dry etching, chemical polishing, mechanical polishing or chemical-mechanical polishing the non-active surface of the wafer.

* * * * *